United States Patent
Strzalkowski

(10) Patent No.: US 11,545,971 B2
(45) Date of Patent: Jan. 3, 2023

(54) AGING PROTECTION TECHNIQUES FOR POWER SWITCHES

(71) Applicant: Analog Devices International Unlimited Company, Limerick (IE)

(72) Inventor: Bernhard Strzalkowski, Munich (DE)

(73) Assignee: Analog Devices International Unlimited Company, Limerick (IE)

( * ) Notice: Subject to any disclaimer, the term of this patent is extended or adjusted under 35 U.S.C. 154(b) by 421 days.

(21) Appl. No.: 16/717,817

(22) Filed: Dec. 17, 2019

(65) Prior Publication Data

US 2021/0184666 A1   Jun. 17, 2021

(51) Int. Cl.
| | |
|---|---|
| *G01R 31/327* | (2006.01) |
| *H03K 17/082* | (2006.01) |
| *G06F 11/00* | (2006.01) |
| *H03K 17/08* | (2006.01) |

(52) U.S. Cl.
CPC ......... *H03K 17/082* (2013.01); *G01R 31/327* (2013.01); *G06F 11/008* (2013.01); *H03K 2017/0806* (2013.01)

(58) Field of Classification Search
CPC ..... G01R 31/333–3333; G01R 31/3271–3274; G01R 31/3275–3278; Y02B 70/30; H04L 1/22; H04L 49/552
See application file for complete search history.

(56) References Cited

U.S. PATENT DOCUMENTS

| | | | |
|---|---|---|---|
| 5,408,150 A | 4/1995 | Wilcox | |
| 5,448,441 A | 9/1995 | Raposa | |
| 5,499,186 A * | 3/1996 | Carosa | H02P 29/02 |
| | | | 318/811 |
| 6,225,797 B1 * | 5/2001 | Willis | G05F 1/573 |
| | | | 323/908 |
| 7,330,046 B2 | 2/2008 | Duerbaum | |
| 7,360,848 B2 * | 4/2008 | Sakata | B60T 17/18 |
| | | | 318/434 |
| 7,499,252 B2 | 3/2009 | Raimondi et al. | |
| 7,893,676 B2 | 2/2011 | Hanna | |
| 8,614,866 B2 | 12/2013 | Billingsley et al. | |
| 8,657,489 B2 | 2/2014 | Ladurner et al. | |
| 9,030,054 B2 | 5/2015 | Jacobson et al. | |
| 9,280,165 B2 * | 3/2016 | Fujii | G05F 1/569 |
| 9,998,111 B2 | 6/2018 | Ngo et al. | |
| 10,164,625 B2 | 12/2018 | Hirata | |

(Continued)

FOREIGN PATENT DOCUMENTS

| | | |
|---|---|---|
| CN | 103248237 B | 8/2015 |
| EP | 0708529 A2 | 4/1996 |
| EP | 0740491 A1 | 10/1996 |

*Primary Examiner* — Patrick Assouad
*Assistant Examiner* — Demetrius R Pretlow
(74) *Attorney, Agent, or Firm* — Schwegman Lundberg & Woessner, P.A.

(57) ABSTRACT

The present disclosure provides techniques for predicting failure of power switches and taking action based on the predictions. In an example, a method can include controlling the at least two parallel-connected power switches via a first driver and a second driver, the first a second driver responsive to a single command signal, measuring a failure characteristic of a first power switch, and disabling a first driver of the first power switch when the first failure characteristic exceeds a failure precursor threshold.

17 Claims, 3 Drawing Sheets

(56) References Cited

U.S. PATENT DOCUMENTS

| | | | |
|---|---|---|---|
| 10,263,412 B2 | 4/2019 | Huber | |
| 10,365,322 B2 | 7/2019 | Coyne et al. | |
| 2006/0250188 A1* | 11/2006 | Kaya | H03F 3/217 330/277 |
| 2010/0265816 A1* | 10/2010 | Johnson | G01R 31/3274 370/244 |
| 2012/0063180 A1* | 3/2012 | Mizuno | H02H 7/12 363/50 |
| 2014/0043058 A1* | 2/2014 | Onishi | G01R 31/52 324/762.01 |
| 2014/0055059 A1* | 2/2014 | Uryu | H02P 27/06 318/9 |
| 2015/0372471 A1* | 12/2015 | Sato | H02M 7/48 361/18 |
| 2015/0372670 A1* | 12/2015 | Montemezzo | H03K 17/18 307/115 |
| 2016/0020688 A1* | 1/2016 | Osanai | H02M 7/5387 327/109 |
| 2016/0087422 A1* | 3/2016 | Mourrier | H02H 7/122 361/101 |
| 2016/0099569 A1* | 4/2016 | Rilling | H02J 3/38 324/424 |
| 2016/0329702 A1* | 11/2016 | Sun | H02H 9/004 |
| 2018/0205220 A1* | 7/2018 | Elliott | H02H 7/222 |
| 2019/0097631 A1 | 3/2019 | Lim et al. | |
| 2019/0250046 A1 | 8/2019 | Sun et al. | |
| 2019/0369164 A1* | 12/2019 | Wijesundera | G01R 31/3277 |
| 2020/0021282 A1* | 1/2020 | Yamamoto | H03K 17/168 |
| 2020/0041568 A1* | 2/2020 | Oehler | G01R 31/50 |
| 2020/0174075 A1* | 6/2020 | Ham | H02J 7/0045 |
| 2020/0328660 A1* | 10/2020 | Guo | H02H 3/05 |
| 2021/0351604 A1* | 11/2021 | Mizoguchi | H02J 7/0047 |

\* cited by examiner

AGING PROTECTION TECHNIQUES FOR POWER SWITCHES

TECHNICAL FIELD OF THE DISCLOSURE

The present disclosure is drawn to transistors and more particularly to techniques for predicting failure of the transistors and for taking action based on the predictions.

BACKGROUND

Electronic equipment has become very robust as new developments have come about and have evolved. However, electronic failure is inevitable. Because of the apparent unpredictability of electronic equipment failure, user can often be caught without the resources to quickly fix the problem. In some situations, the failure can lead to other issues because of the apparat and uncontrolled shutdown resulting from the failure.

SUMMARY OF THE DISCLOSURE

The present disclosure provides techniques for predicting failure of power switches and taking action based on the predictions. In an example, a method can include controlling the at least two parallel-connected power switches via a first driver and a second driver, the first a second driver responsive to a single command signal, measuring a first output current of the first driver, the first driver configured to couple to a gate of a first one of the at least two parallel-connected power switches, and disabling the first driver when the first output current exceeds a gate leakage threshold.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
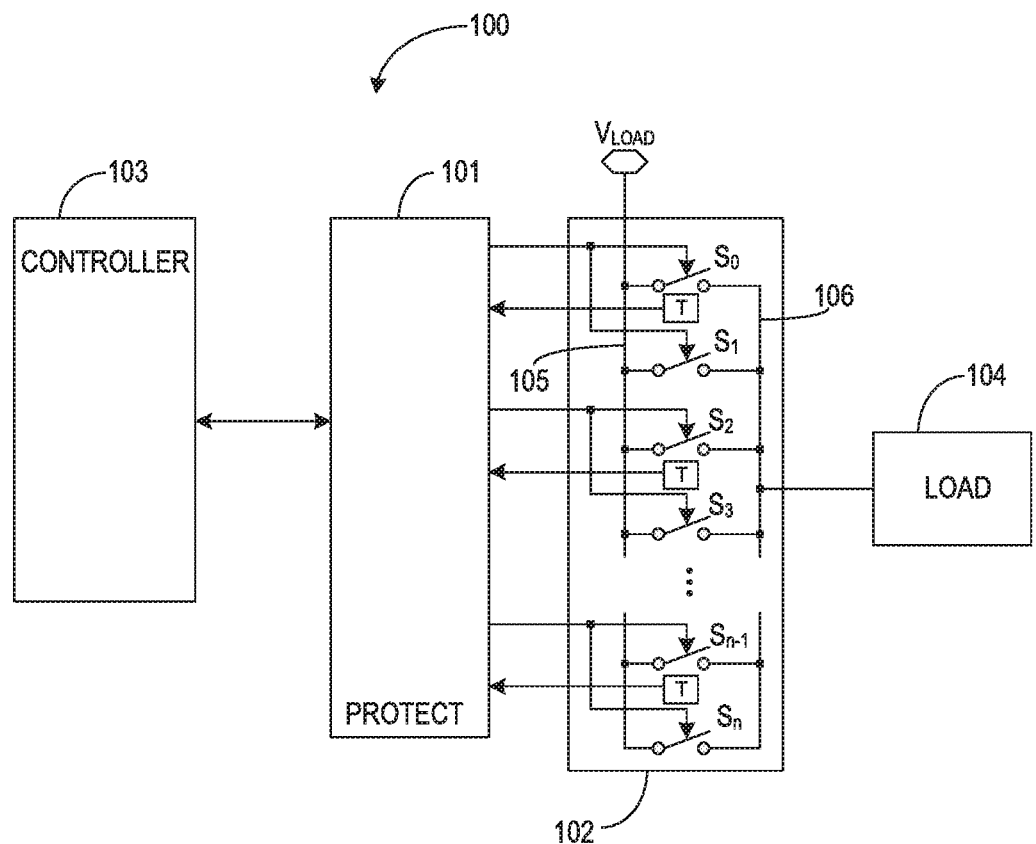
FIG. 1 illustrates an example system employing a power stage of redundant switches or power transistors and an example protection circuit.

FIG. 1 illustrates an example system 100 employing a power stage 102 of redundant switches or power transistors and an example protection circuit 101. The system 100 can include the power stage 102, a controller 103, the protection circuit 101 and a load 104. In certain examples, the power stage 102 can include a set of two or more switches ($S_0$, $S_1$, ..., $S_n$) coupled in parallel between first and second conductors 105, 106 of the system 100. In certain examples, the system 100 can include more than one set of the two or more switches. For example, if the system is driving a motor, each phase of the motor can be coupled to a set of two or more switches. The controller 103 can provide a command signal to control each set of two or more switches. In certain examples, the protection circuit 101 can include a measurement circuit and can predict potential failure of a portion, or subset of switches, of the set of two or more parallel-connected power switches ($S_0$, $S_1$, ..., $S_n$) and can disable the driver of the potentially faulty portion and allow the other portions of the set of switches to operate the system 100 in a prescribed manner until the faulty portion can be repaired or replaced. In certain examples, each portion of the set of two or more switches ($S_0$, $S_1$, ..., $S_n$) can include one or more switches. In certain examples, a switch can include a transistor, such as a power transistor. Characteristics that can assist in predicting potential failure of a switch or portion of a switch circuit can be called aging precursors. Aging precursors can include, among others, junction temperature of a switch, gate leakage, drain-to-source resistance, drain-to-source resistance change, gate threshold voltage shift, Miller plateau shift, or combinations thereof.

In certain examples, a first predictor of switch failure can be higher than expected temperature of the switch or a set of switches. A second predictor of switch failure can be gate leakage current. The protection circuit 101 can include a driver for each portion of the set of switches. Each driver can control a portion of the set of switches responsive to a single command signal of the controller 103. In certain examples, each driver can provide a control signal to a gate of one or more power switches of a corresponding portion of the set of two or more switches ($S_0$, $S_1$, ..., $S_n$). The measurement circuit can receive indications of gate leakage and temperature of each portion of the set of switches, can process various signals of the measurement circuit, can disable a potentially faulty driver, and can optionally provide an indication of whether a driver is enabled or not.

Figure 2:
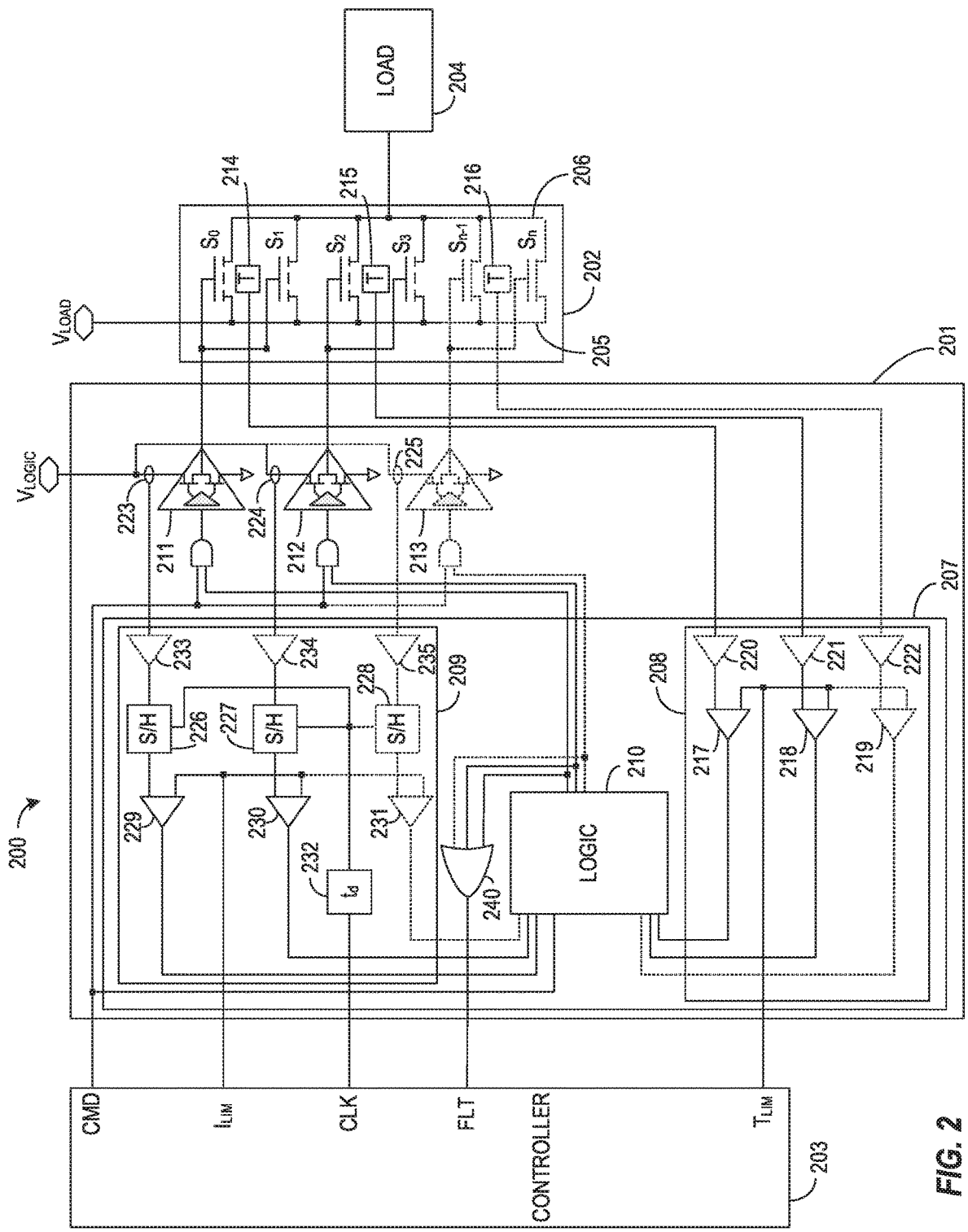
FIG. 2 illustrates generally a more detailed schematic of an example system.

FIG. 2 illustrates generally a more detailed schematic of an example system 200. The system 200 includes a power stage 202, a controller 203, a protecting circuit 201 including a measurement circuit 207, and a load 204. The power stage 202 can include a set of two or more parallel-connected switches ($S_0$, $S_1$, ..., $S_n$) coupled in parallel between first and second conductors 205, 206 of the system 200. In certain examples, the measurement circuit 207 can also include drivers 211, 212, 213 for each portion of the set of two or more parallel-connected switches ($S_0$, $S_1$, ..., $S_n$). In some examples, the drivers 211, 212, 213 can be external to the measurement circuit 201. The drivers 211, 212, 213 can buffer a command signal (CMD) of the controller 2030 from the gate drive signal used to control the corresponding portion of the two or more parallel-connected switches ($S_0$, $S_1$, ..., $S_n$). In some examples, the driver 211, 212, 213 can also amplify an aspect of the command signal to generate the gate drive signal. IN certain examples, the drivers can have a first supply ($V_{LOGIC}$) and the load can have a second supply ($V_{LOAD}$).

In certain examples, the measurement circuit 201 can include a temperature circuit 208 and a gate leakage circuit 209. The temperature circuit 208 can receive a signal indicative of a junction temperature of each portion of the set of two or more parallel-connected switches ($S_0$, $S_1$, ..., $S_n$), and a temperature threshold ($T_{LIM}$). In certain examples, temperature inputs of the temperature circuit 208 can be coupled to one or more temperature sensors 214, 215, 216 of each portion of the set of switches ($S_0$, $S_1$, ..., $S_n$). The temperature circuit 208 can process the received signals and can generate a signal for each corresponding portion of the set of two or more parallel-connected switches ($S_0$, $S_1$, . . . , $S_n$) indicating whether the corresponding portion has an excessive junction temperature or not.

The gate leakage circuit 209 can receive an indication of the output current of each driver 211, 212, 213, a clock (CLK) or delay signal, and one or more leakage current thresholds ($I_{LIM}$). The gate leakage circuit 209 can process the received signals and can generate a signal indicative of whether one of the portions of the set of two or more parallel-connected switches ($S_0$, $S_1$, . . . , $S_n$) has excessive gate leakage current.

In certain examples, the measurement circuit 207 can include logic circuitry 210 to receive the signals generated by the gate leakage circuit 209 and the temperature circuit 208 and can generate disable signals for a corresponding portion of the set of two or more parallel-connected switches ($S_0$, $S_1$, . . . , $S_n$). As such, the protection circuit 201 can monitor characteristics of the set of two or more parallel-connected switches ($S_0$, $S_1$, . . . , $S_n$). The trend or level of the characteristics can indicate increased probability of imminent failure. Upon a trend or level of a characteristic crossing a threshold, the protection circuit 201 can disable a portion of the power stage 202 to allow continued operation until the disable portion can be repaired or replaced. In some applications, the protection circuit 201 can allow continued operation at full power if the enable portions of the set of two or more parallel-connected switches ($S_0$, $S_1$, . . . , $S_n$) have designed redundancy. In other applications, the protection circuit 201 can allow for continued operation at reduced power. In yet other operations, the protection circuit 201 can allow the controller 203 to provide a controlled shutdown of the system 200. In such systems, the logic circuitry 210 may optionally include delay elements to delay disabling a corresponding driver 211, 212, 213 after detecting a failure precursor condition. Such delay elements can allow the controller 203 to execute a full-power shutdown as opposed to a reduced power shutdown if a driver is disabled immediately upon detecting the failure precursor condition. In certain examples, the logic circuitry 210 can include logic elements to gate the disable signals with the command signal (CMD). In certain examples, the logic circuitry 210 can synchronize activation of a disable signal of a driver with the command signal (CMD) such that the driver of the parallel-connected switches, or portion thereof, are disabled only when they are in a desired state. For example, if a junction temperature or a gate leakage current exceeds a respective threshold, the corresponding driver can be allowed to complete a duty cycle of the respective power switches before being disabled instead of, for example, abruptly shutting down one or more switches while they are conducting load current during a switching cycle. In certain examples, the logic circuitry 210 can include an OR-gate 240, for example, to generate an output fault signal (FLT) for reception by the controller 203.

Referring again to FIG. 2, in an example, the temperature circuit 208 can include comparators 217, 218, 219 and optional amplifiers 220, 221, 222. The amplifiers 220, 221, 222 can condition the signals received from the temperature sensors 214, 215, 216 embedded with the power stage 202. The comparators 217, 218, 219 can compare the temperature signals with a temperature threshold ($T_{LIM}$) to generate a signal corresponding to each portion of the power stage 202 and indicating whether the portion is experiencing a precursor temperature indicative of relatively imminent failure.

In an example, the gate leakage circuit 209 can include, for each portion of the set of two or more parallel-connected switches ($S_0$, $S_1$, . . . , $S_n$), a current sensor 223, 224, 225, a sample and hold circuit 226, 227, 228, and a comparator 229, 230, 231. In certain examples, the current sensors 223, 224, 225 can be external to the gate leakage circuit 209. The gate leakage circuit 209 can also include a delay element 232. In some examples, the signal received from the current sensors 223, 224, 225 can be conditioned with an optional amplifier 233, 234, 235. During operation, the output current of the corresponding driver 211, 212, 213 can be sampled and compared to a current leakage threshold ($I_{LIM}$). If the sampled current is higher than the current leakage threshold ($I_{LIM}$), the output of the corresponding comparator 229, 230, 231 can indicate that the gate leakage of the corresponding portion of the set of two or more parallel-connected switches ($S_0$, $S_1$, . . . , $S_n$) is high enough to serve as a failure precursor. In certain examples, the gate leakage circuit 209 can provide a comparator output for each portion of the set of two or more parallel-connected switches ($S_0$, $S_1$, . . . , $S_n$). In certain examples, the current level of interest can occur momentarily while the portion of the set of two or more parallel-connected switches ($S_0$, $S_1$, . . . , $S_n$) of interest is in a low-impedance state. As such, the delay element 232 can receive the clock signal (CLK) and can provide a sample strobe to the sample and hold circuits 226, 227, 228 of each portion of set of two or more parallel-connected switches ($S_0$, $S_1$, . . . , $S_n$). Upon the activation of the strobe, each sample and hold circuit 226, 227, 228 can capture a signal representative of the output current of the corresponding driver 211, 212, 213. The output current of the corresponding driver 211, 212, 213 can provide an indication of the gate leakage for the one or more switches in the corresponding portion of the set of two or more parallel-connected switches ($S_0$, $S_1$, . . . , $S_n$).

Figure 3:
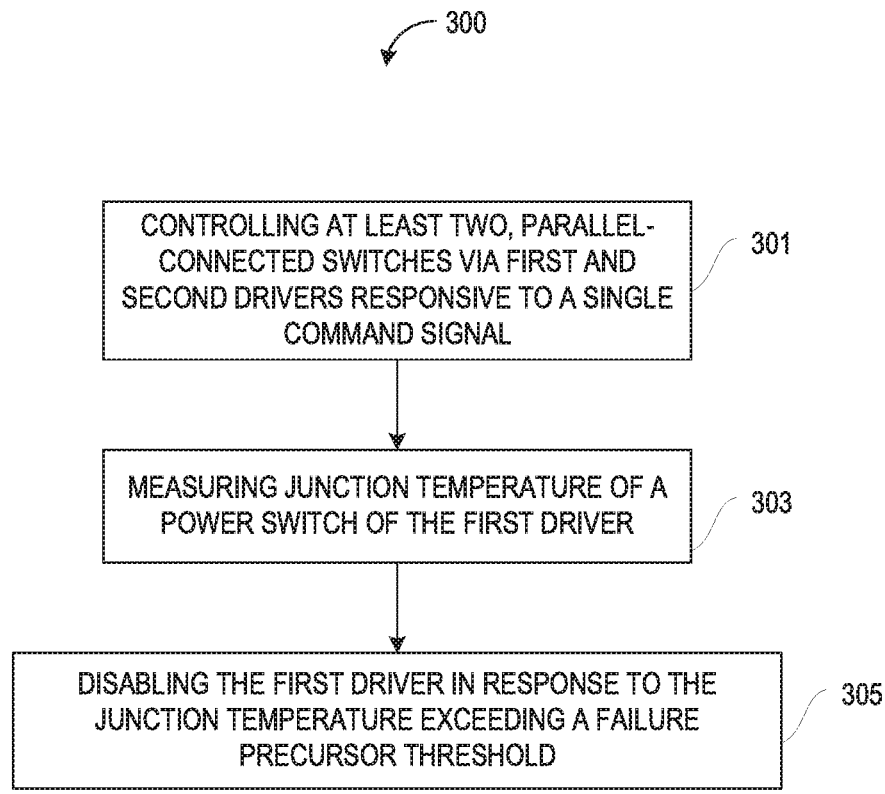
FIG. 3 illustrates generally a flowchart of an example method of monitoring and acting on failure precursors of a power stage.

FIG. 3 illustrates generally a flowchart of an example method 300 of monitoring and acting on failure precursors of a power stage. At 301, the at least two parallel-connected power switches can be controlled via a first and second drivers responsive to a single command signal. In certain examples, the single command signal can be received as an input to both the first driver and the second driver. In certain examples, each of the at least two parallel-connected power switches have a first terminal coupled to a single power rail, a second terminal coupled to a single load and a control terminal coupled to an output of either the first driver or the second driver. At 303, junction temperature of a first power switch, or multiple parallel-connected power switches, can be measured or sampled. In some examples, the junction temperature of a second power switch of the parallel-connected power switches can be monitored or sampled. In some examples, the junction temperature of two or more power switches coupled in parallel can be monitored simultaneously. At 305, upon a sensed junction temperature of a power switch, or of a set of power switches, indicating excessive temperature, the corresponding driver can be disabled. Excessive junction temperature of a transitory power switch can be a precursor to a corresponding power transistor failing.

Excessive gate leakage of a power switch can also be a precursor to failure of the power switch. In some examples, output current of the first driver can be measured or sampled. In some examples, an output of a current sensor capable of measuring a current level of the current supplied to the first driver can be sampled via a sample and hold circuit as discussed above. The supplied current of the driver can provide an indication of gate leakage of a corresponding one or more switches of the at least two parallel-connected power switches.

In some examples, the leakage current of the switches corresponding to the second driver can be monitored by measuring or sampling the current supplied to the second driver. In some examples, the leakage current of two or more drivers can be monitored simultaneously. Upon a sensed current associated with a driver of a switch, or with a set of switches, indicating excessive gate leakage, the corresponding driver can be disabled.

In addition, in some examples, a feedback signal can be provided to a controller of the at least two parallel-connected power switches to indicate a portion of the at least two parallel-connected power switches have been disabled or are about to be disabled. Such a feedback indication can allow the controller to compensate for the disable portion of switches, reduce output power, begin a shutdown process to controllably stop the system, or combination thereof. In certain examples, both the gate leakage current and the junction temperature of the switches can be monitor simultaneously and compared to respective thresholds. If one of the electrical characteristics, gate leakage or junction temperature, exceed the respective threshold, a feedback signal can indicate a precursor to power switch failure has been detected, and the corresponding driver can be disabled.

NOTES AND EXAMPLES

In a first Example, Example 1, a driver circuit for a power stage including at least two parallel-connected power switches can include a first driver configured to provide a first control signal to a first power switch of the at least two parallel-connected power switches in response to a state of a first command signal, a second driver configured to provide a second control signal to a second power switch of the at least two parallel-connected power switches in response to the state of the first command signal, a measurement circuit configured to receive a failure characteristic measurement of an operating state of the at least two parallel-connected power switches and compare the failure characteristic measurement with a threshold to provide a failure indication of one of the at least two parallel-connected power switches, and a logic circuit configured to receive the failure indication and to selectively disable a respective driver of the first and second drivers in response to a failure state of the failure indication.

In Example 2, the measurement circuit of Example 1 optionally includes a gate leakage circuit configured to receive a representation of a gate leakage current of the at least two parallel-connected power switches as the failure characteristic measurement, to compare the representation to a first threshold, and to provide a first comparison result. In certain examples, the failure indication optionally includes the first comparison result.

In Example 3, the measurement circuit of any one or more of Examples 1-2 optionally includes a junction temperature comparator circuit configured to receive a first representation of junction temperature of the at least two parallel-connected power switches as at least a portion of the failure characteristic measurement, to compare the first representation to a first threshold, and to provide a first comparison result, and wherein the failure indication includes the first comparison result.

In Example 4, the measurement circuit of any one or more of Examples 1-3 optionally includes a gate leakage circuit configured to receive a second representation of a gate leakage current of the at least two parallel-connected power switches as a second portion of the failure characteristic measurement, to compare the second representation to a second threshold, and to provide a second comparison result, and wherein the failure indication includes the second comparison result.

In Example 5, the logic circuit of any one or more of Examples 1-4 optionally is configured to selectively disable a respective driver of the first and second drivers in response to a positive state of the first comparison result or the second comparison result.

In Example 6, the gate leakage circuit of any one or more of Examples 1-5 optionally includes a first sample and hold circuit can configured sample a first current sense signal responsive to a first clock signal, and a second sample and hold circuit can configured sample a second current sense signal responsive to the first clock signal.

In Example 7, the gate leakage circuit of any one or more of Examples 1-6 optionally includes a first comparator configured to receive the first threshold and an output of the first sample and hold circuit, a second comparator configured to receive the first threshold and an output of the second sample and hold circuit, and wherein the failure indication includes an output of the first comparator and an output of the second comparator.

In Example 8, a method of modulating a power stage including at least two parallel-connected power switches can include controlling the at least two parallel-connected power switches via a first driver and a second driver, the first and second driver responsive to a single command signal, receiving a first temperature signal of the first one of the at least two parallel-connected power switches, comparing the first temperature signal to a temperature threshold, and disabling the first driver in response to the first temperature signal exceeding the temperature threshold.

In Example 9, the method of any one or more of Examples 1-8 optionally includes receiving a second temperature signal of a second one of the at least two parallel-connected power switches, and comparing the second temperature signal to a temperature threshold.

In Example 10, the method of any one or more of Examples 1-9 optionally includes disabling the second driver in response to the second temperature signal exceeding the temperature threshold.

In Example 11, the method of any one or more of Examples 1-10 optionally includes receiving a first temperature signal of the first one of the at least two parallel-connected power switches, and comparing the first temperature signal to a temperature threshold.

In Example 12, the method of any one or more of Examples 1-11 optionally includes disabling the first driver in response to the first temperature signal exceeding the temperature threshold.

In Example 13, the method of any one or more of Examples 1-12 optionally includes measuring a first output current of the first driver, the first driver configured to couple to a gate of a first one of the at least two parallel-connected power switches.

In Example 14, the method of any one or more of Examples 1-13 optionally includes disabling the first driver when the first output current exceeds a gate leakage threshold.

In Example 15, the method of any one or more of Examples 1-14 optionally includes measuring a second output current of the second driver, the second driver configured to couple to a gate of a second one of the at least two parallel-connected power switches, and disabling the second driver when the second output current exceeds the gate leakage threshold.

In Example 16, the measuring the first output current of any one or more of Examples 1-15 optionally includes sampling the first output current in response to a clock signal to provide a first gate leakage sample, holding the first gate leakage sample, and comparing the first gate leakage sample with the gate leakage threshold.

In Example 17, a protection circuit for a power stage the power stage including at least two parallel-connected power switches can include means for driving a first one of the at least two parallel-connected power switches, means for driving a second one of the at least two parallel-connected power switches, means for disabling the means for driving the first one of the at least two parallel-connected power switches in response to gate current of the first one of the at least two parallel-connected power switches exceeding a gate leakage threshold, and means for disabling the means for driving the second one of the at least two parallel-connected power switches in response to gate current of the first one of the at least two parallel-connected power switches exceeding a gate leakage threshold.

In Example 18, the protection circuit of any one or more of Examples 1-17 optionally includes second means for disabling the means for driving the first one of the at least two parallel-connected power switches in response to a first temperature of the first one of the at least two parallel-connected power switches exceeding a temperature threshold.

In Example 19, the protection circuit of any one or more of Examples 1-18 optionally includes second means for disabling the means for driving the second one of the at least two parallel-connected power switches in response to a second temperature of the second one of the at least two parallel-connected power switches exceeding the temperature threshold.

In Example 20, the protection circuit of any one or more of Examples 1-19 optionally includes means for providing an first indication of whether the means for driving the first one of the at least two parallel-connected power switches is enabled or not and for providing a second indication of whether the means for driving the second one of the at least two parallel-connected power switches is enabled or not.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A driver circuit for a power stage including at least two parallel-connected power switches, the driver circuit comprising:
   a first driver configured to provide a first control signal to a first power switch of the at least two parallel-connected power switches in response to a state of a first command signal;
   a second driver configured to provide a second control signal to a second power switch of the at least two parallel-connected power switches in response to the state of the first command signal;
   a measurement circuit including a gate leakage circuit configured to receive a failure characteristic measurement of an operating state of the at least two parallel-connected power switches as a representation of a gate leakage current, wherein the measurement circuit is configured to compare the failure characteristic measurement with a first threshold to provide a failure indication of one of the at least two parallel-connected power switches; and
   a logic circuit configured to receive the failure indication and to selectively disable a respective driver of the first and second drivers in response to a failure state of the failure indication.

2. The driver circuit of claim 1, wherein the measurement circuit includes a junction temperature comparator circuit configured to receive a first representation of junction temperature of the at least two parallel-connected power switches as at least a portion of the failure characteristic measurement, to compare the first representation to a first threshold, and to provide a first comparison result; and
   wherein the failure indication is based at least in part on the first comparison result.

3. The driver circuit of claim 2, wherein the gate leakage circuit includes:
   a first sample and hold circuit can configured sample a first current sense signal responsive to a first clock signal; and
   a second sample and hold circuit can configured sample a second current sense signal responsive to the first clock signal.

4. The driver circuit of claim 3, wherein the gate leakage circuit includes:
   a first comparator configured to receive the first threshold and an output of the first sample and hold circuit;
   a second comparator configured to receive the first threshold and an output of the second sample and hold circuit; and
   wherein the failure indication includes an output of the first comparator and an output of the second comparator.

5. A method of modulating a power stage, the power stage including at least two parallel-connected power switches, the method comprising:
   controlling the at least two parallel-connected power switches via a first driver and a second driver, the first and second driver responsive to a single command signal;
   receiving a gate leakage signal, wherein the signal is related to a measurement of a first output current of the first driver, the first driver configured to couple to a gate of a first driver of the at least two parallel-connected power switches;
   receiving a first temperature signal of the first driver of the at least two parallel-connected power switches;
   comparing the first temperature signal to a temperature threshold; and
   disabling the first driver in response to the first temperature signal and/or the gate leakage signal exceeding a respective specified threshold.

6. The method of claim 5, including receiving a second temperature signal of a second one of the at least two parallel-connected power switches; and
   comparing the second temperature signal to a temperature threshold.

7. The method of claim 6, including disabling the second driver in response to the second temperature signal exceeding the temperature threshold.

8. The method of claim 7, including receiving a first temperature signal of the first driver of the at least two parallel-connected power switches; and
   comparing the first temperature signal to a temperature threshold.

9. The method of claim 8, including disabling the first driver in response to the first temperature signal exceeding the temperature threshold.

10. The method of claim 5, including measuring a second output current of the second driver, the second driver configured to couple to a gate of a second driver of the at least two parallel-connected power switches; and
    disabling the second driver when the second output current exceeds the gate leakage threshold.

11. The method of claim 5, wherein measuring the first output current includes sampling the first output current in response to a clock signal to provide a first gate leakage sample; and
    holding the first gate leakage sample; and
    comparing the first gate leakage sample with a gate leakage threshold.

12. A protection circuit for a power stage the power stage including at least two parallel-connected power switches, the protection circuit comprising:
    a first driver for driving a first parallel-connected power switch of the at least two parallel-connected power switches;
    a second driver for driving a second parallel-connected power switch of the at least two parallel-connected power switches;
    a logic circuit for disabling the first driver for driving the first parallel-connected power switch of the at least two parallel-connected power switches in response to gate current of the first parallel-connected power switch of the at least two parallel-connected power switches exceeding a gate leakage threshold, and disabling the second driver for driving the second parallel-connected power switch of the at least two parallel-connected power switches in response to gate current of the second parallel-connected power switch of the at least two parallel-connected power switches exceeding a gate leakage threshold.

13. The protection circuit of claim 12, including a controller for disabling the first driver driving the first parallel-connected power switch of the at least two parallel-connected power switches in response to a first temperature of the first parallel-connected power switch of the at least two parallel-connected power switches exceeding a temperature threshold.

14. The protection circuit of claim 13, wherein the controller further includes for disabling the second driver driving the second parallel-connected power switch of the at least two parallel-connected power switches in response to a second temperature of the second parallel-connected power switch of the at least two parallel-connected power switches exceeding the temperature threshold.

15. The protection circuit of claim 14, including logic circuitry for providing a first indication of whether the first driver driving the first parallel-connected power switch of the at least two parallel-connected power switches is enabled or not and for providing a second indication of whether the second driver for driving the second parallel-connected power switch of the at least two parallel-connected power switches is enabled or not.

16. The driver circuit of claim 1, wherein the logic circuit is configured to selectively disable the respective driver of the first and second drivers in coordination with a beginning or end of a duty cycle of the power switches.

17. The method of claim 5, wherein disabling the first driver includes in coordination with a beginning or end of a duty cycle of the power switches.

\* \* \* \* \*